United States Patent
Kuo et al.

(10) Patent No.: US 11,127,701 B2
(45) Date of Patent: Sep. 21, 2021

(54) METHOD OF MANUFACTURING INTERGRATED FAN-OUT PACKAGE WITH REDISTRIBUTION STRUCTURE

(71) Applicant: Taiwan Semiconductor Manufacturing Co., Ltd., Hsinchu (TW)

(72) Inventors: Hung-Jui Kuo, Hsinchu (TW); Hui-Jung Tsai, Hsinchu (TW); Jyun-Siang Peng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/442,559

(22) Filed: Jun. 17, 2019

(65) Prior Publication Data

US 2020/0395319 A1    Dec. 17, 2020

(51) Int. Cl.
*H01L 23/00*    (2006.01)
(52) U.S. Cl.
CPC .............. *H01L 24/05* (2013.01); *H01L 24/13* (2013.01); *H01L 2224/024* (2013.01); *H01L 2224/0231* (2013.01); *H01L 2224/02331* (2013.01); *H01L 2224/02379* (2013.01); *H01L 2224/0401* (2013.01); *H01L 2224/13024* (2013.01)
(58) Field of Classification Search
CPC . H01L 24/05; H01L 24/13; H01L 2224/0231; H01L 2224/024; H01L 2224/13024; H01L 2224/02379; H01L 2224/02331
See application file for complete search history.

(56) References Cited

U.S. PATENT DOCUMENTS

| | | | | |
|---|---|---|---|---|
| 4,306,773 | A | * 12/1981 | Arnoldussen | ......... G02F 1/1523 204/164 |
| 4,507,159 | A | * 3/1985 | Erb | ......................... H01L 29/93 257/306 |
| 9,000,584 | B2 | 4/2015 | Lin et al. | |
| 9,048,222 | B2 | 6/2015 | Hung et al. | |
| 9,048,233 | B2 | 6/2015 | Wu et al. | |
| 9,064,879 | B2 | 6/2015 | Hung et al. | |
| 9,111,949 | B2 | 8/2015 | Yu et al. | |
| 9,263,511 | B2 | 2/2016 | Yu et al. | |
| 9,281,254 | B2 | 3/2016 | Yu et al. | |
| 9,368,460 | B2 | 6/2016 | Yu et al. | |
| 9,372,206 | B2 | 6/2016 | Wu et al. | |
| 9,496,189 | B2 | 11/2016 | Yu et al. | |

(Continued)

*Primary Examiner* — Stephen M Bradley
*Assistant Examiner* — Gustavo G Ramallo
(74) *Attorney, Agent, or Firm* — JCIPRNET

(57) ABSTRACT

The present disclosure provides a method of manufacturing a semiconductor package. Semiconductor dies having conductive pillars are provided and are encapsulated with an insulating encapsulant. A redistribution circuit structure is formed on the insulating encapsulant and the semiconductor dies, and the redistribution circuit structure is electrically connected to the semiconductor dies. A photosensitive mask pattern having a plurality of openings is formed. A plurality of conductive vias is formed within the openings of the photosensitive mask pattern. A dielectric layer is then formed, and the conductive vias are embedded in the dielectric layer.

19 Claims, 16 Drawing Sheets

(56) References Cited

U.S. PATENT DOCUMENTS

| | | | |
|---|---|---|---|
| 2006/0040501 A1* | 2/2006 | America | H01L 21/31144 438/706 |
| 2007/0020565 A1* | 1/2007 | Koh | H01L 21/0337 430/313 |
| 2011/0260297 A1* | 10/2011 | Lin | H01L 24/05 257/621 |
| 2015/0243528 A1* | 8/2015 | Whiting | H01L 21/6835 438/113 |
| 2016/0020303 A1* | 1/2016 | Jun | H01L 21/31144 438/299 |
| 2017/0294351 A1* | 10/2017 | Knechtel | H01L 21/76898 |
| 2017/0299960 A1* | 10/2017 | Parker | G03F 1/68 |
| 2018/0040578 A1* | 2/2018 | Yu | H01L 24/19 |
| 2018/0158749 A1* | 6/2018 | Yu | H01L 21/6835 |
| 2019/0096821 A1* | 3/2019 | Chiang | H01L 23/3171 |

\* cited by examiner

METHOD OF MANUFACTURING INTERGRATED FAN-OUT PACKAGE WITH REDISTRIBUTION STRUCTURE

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area. With the growing demand for miniaturization, higher speed, greater bandwidth and lower power consumption, there is a need for smaller and more creative packaging for semiconductor dies. For example, integrated fan-out packages have become increasingly popular due to their compactness. However, with the reduction of product size, having a redistribution circuit structure that copes with the miniaturization scheme is one of key factors for future fan-out packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1A:
FIG. 1A to FIG. 1S are schematic cross-sectional views illustrating a process flow of manufacturing a semiconductor package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
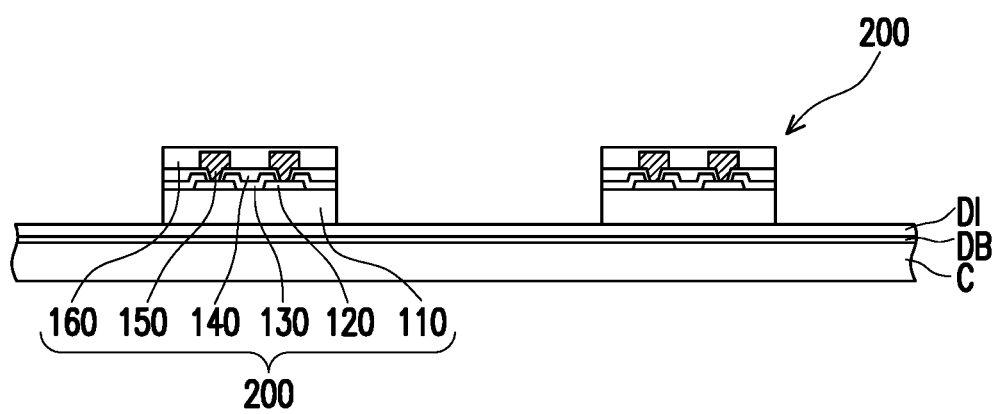
Figure 1C:
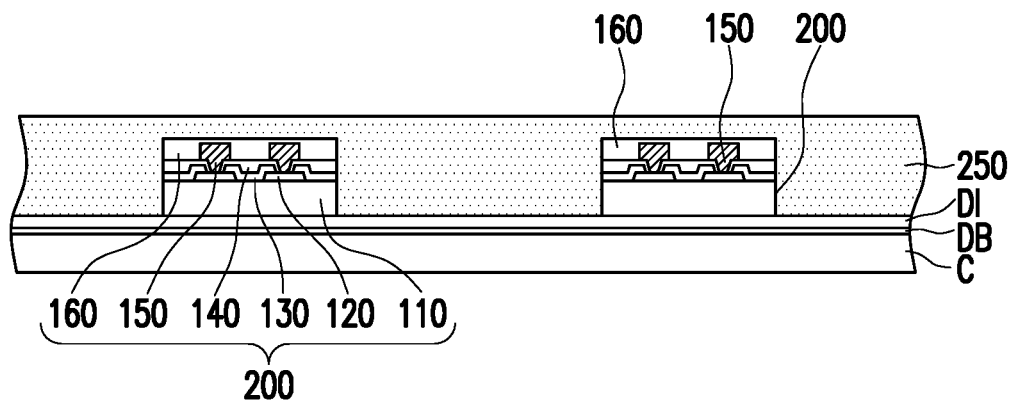
Figure 1D:
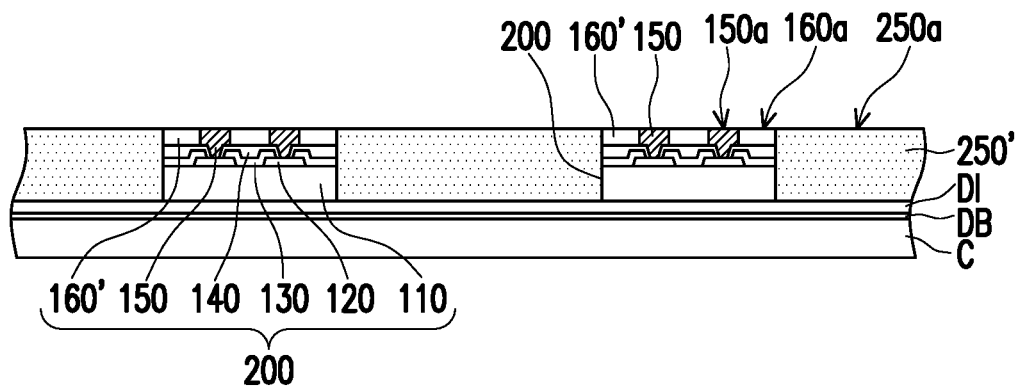
Figure 1E:
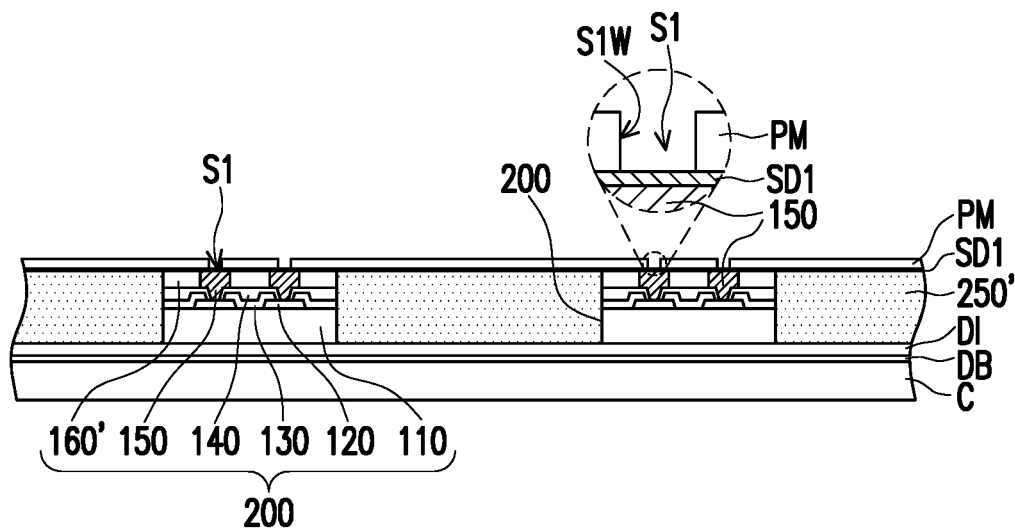
Figure 1F:
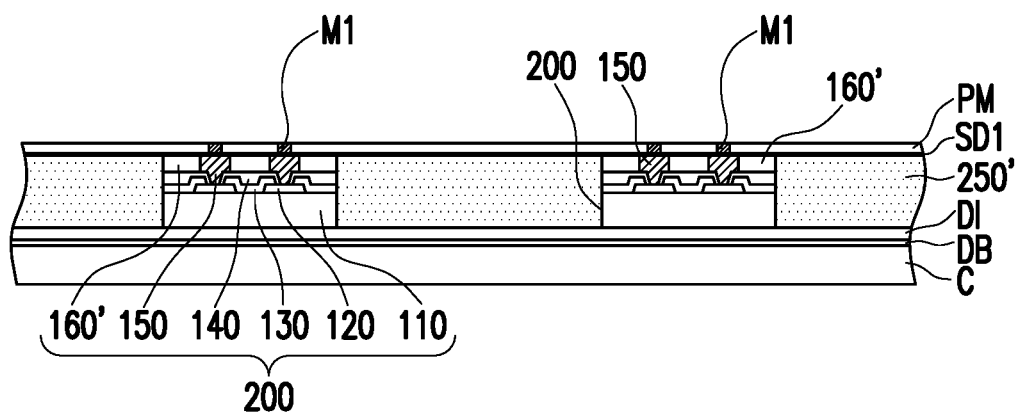
Figure 1G:
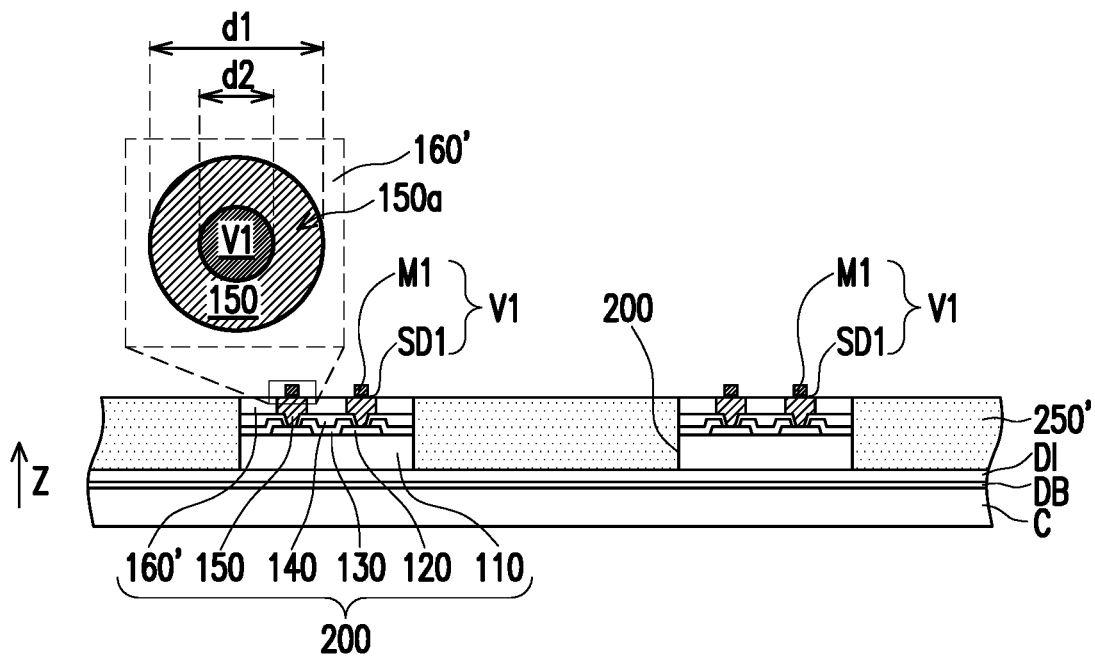
Figure 1H:
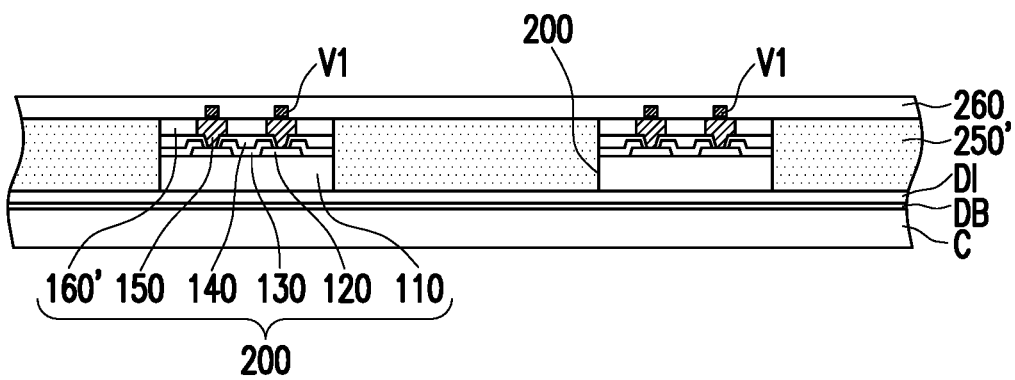
Figure 1I:
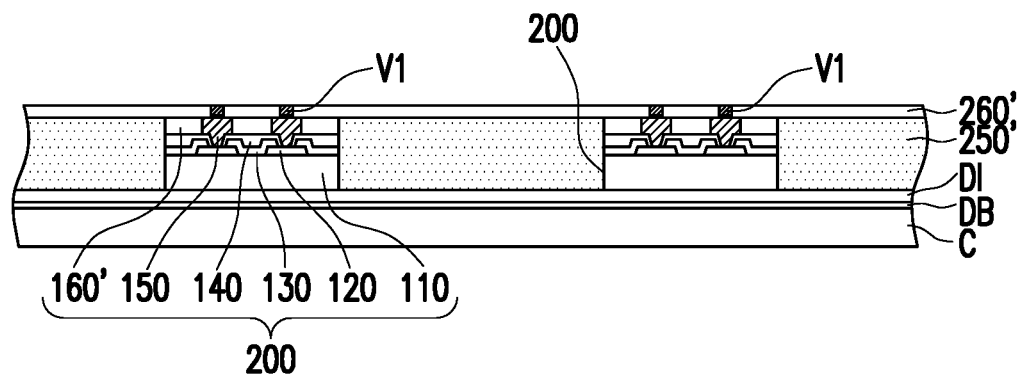
Figure 1J:
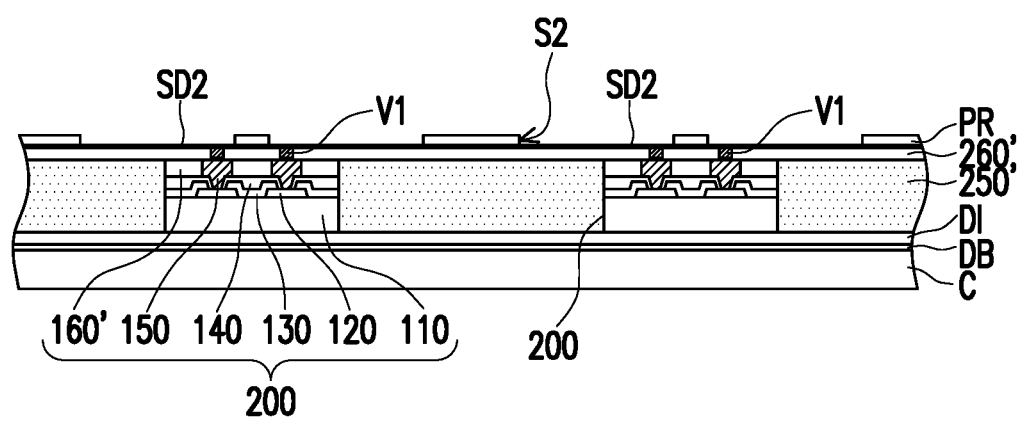
Figure 1K:
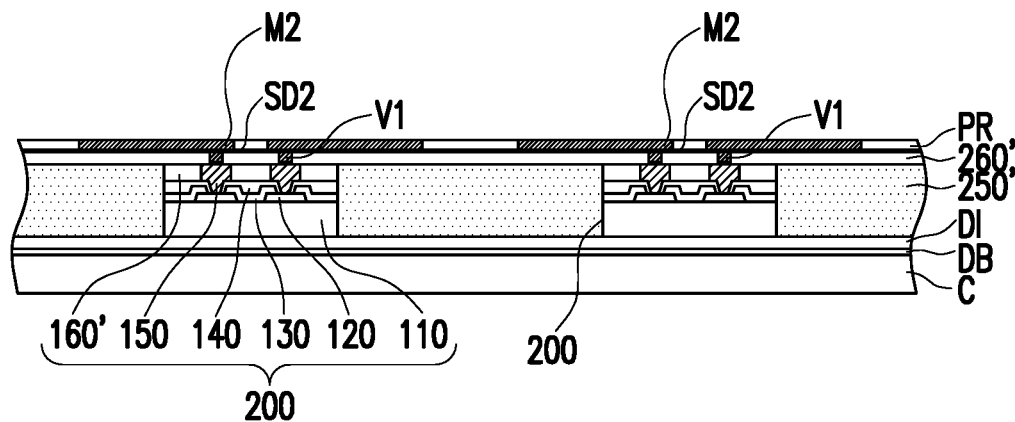
Figure 1L:
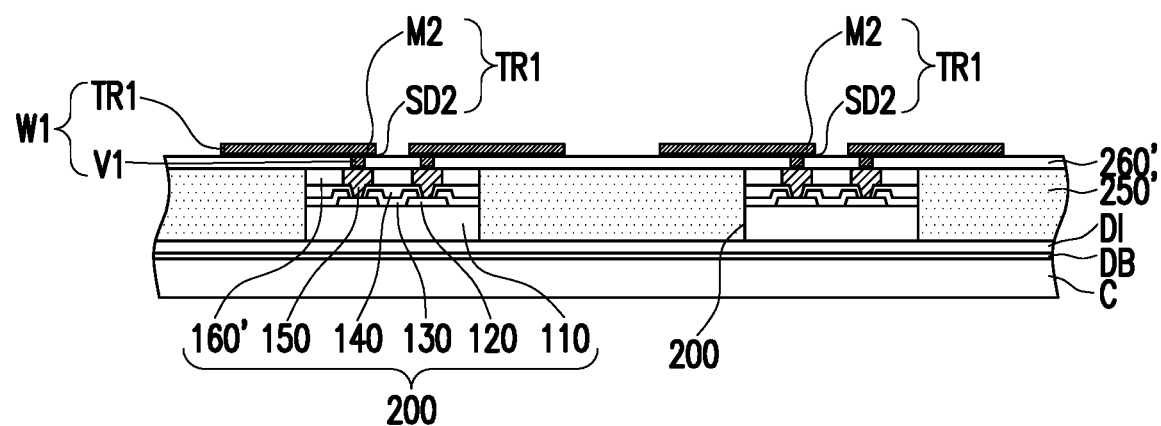
Figure 1M:
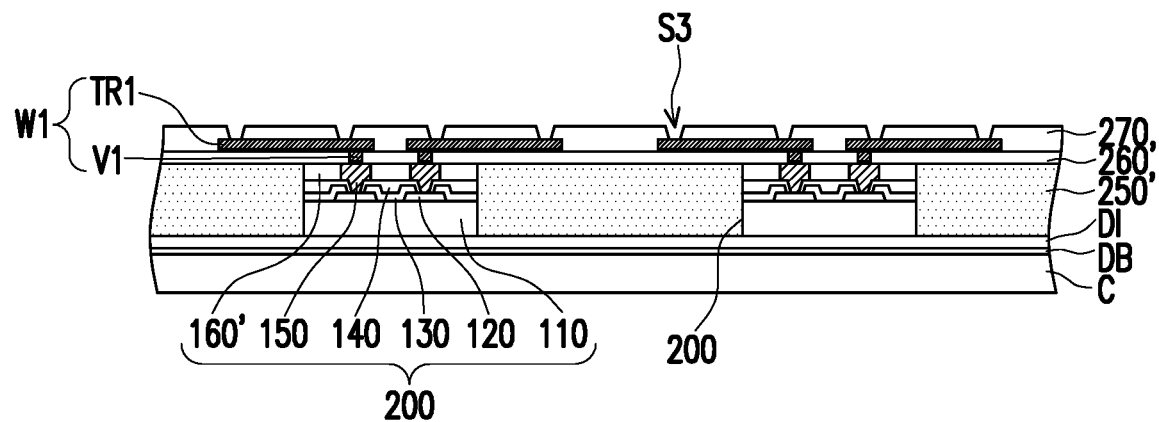
Figure 1N:
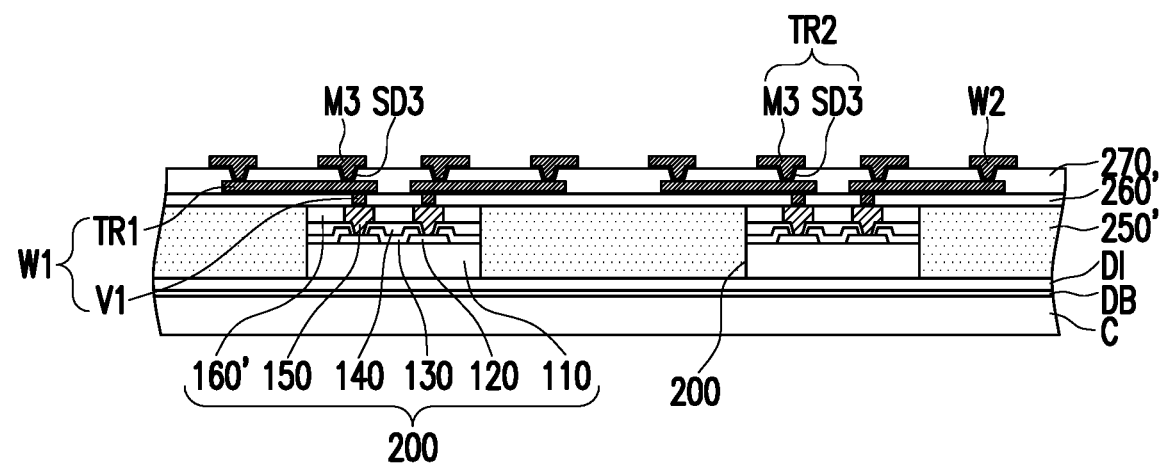
Figure 1O:
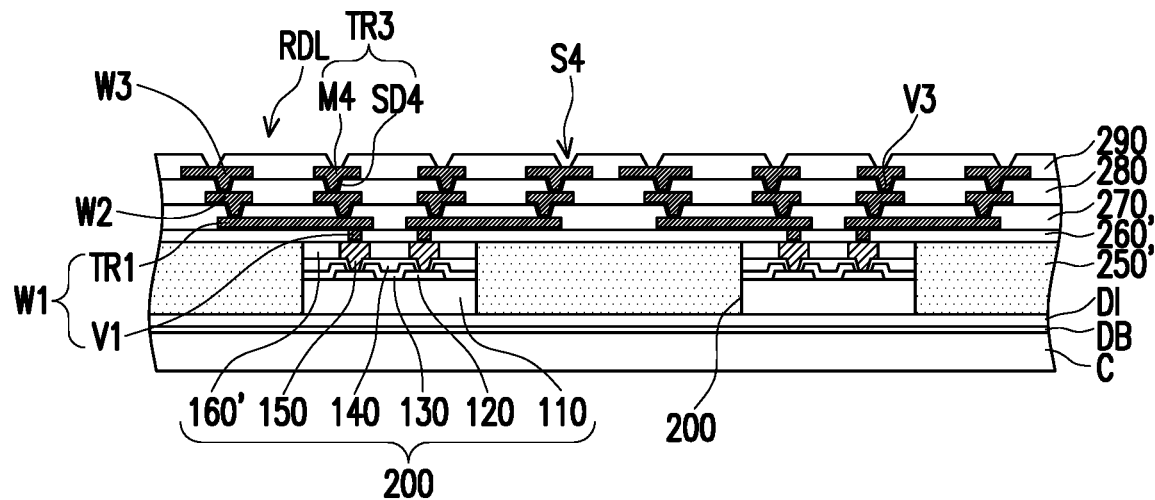
Figure 1P:
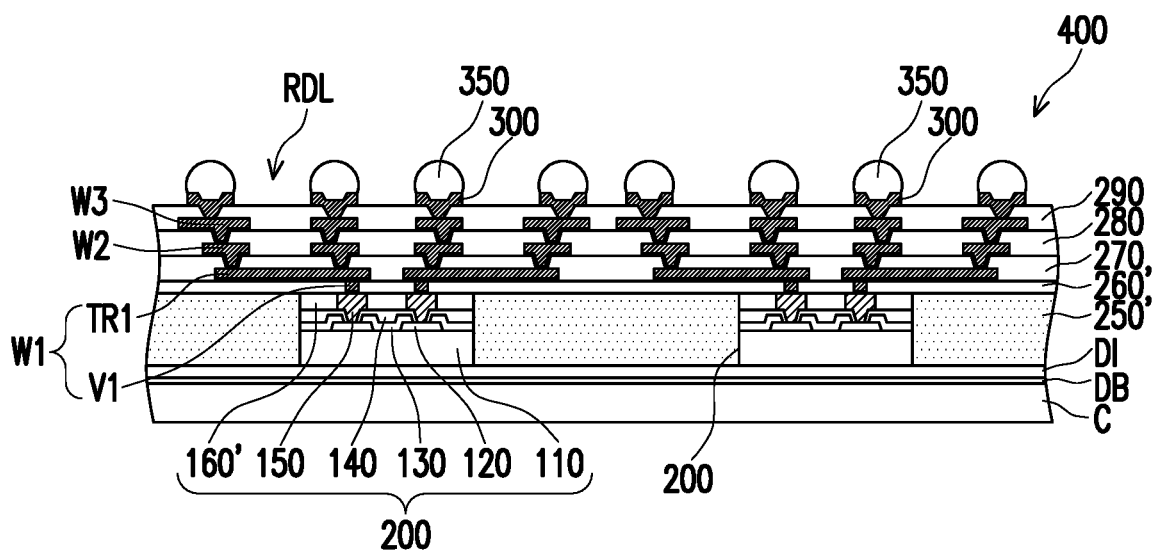
Figure 1Q:
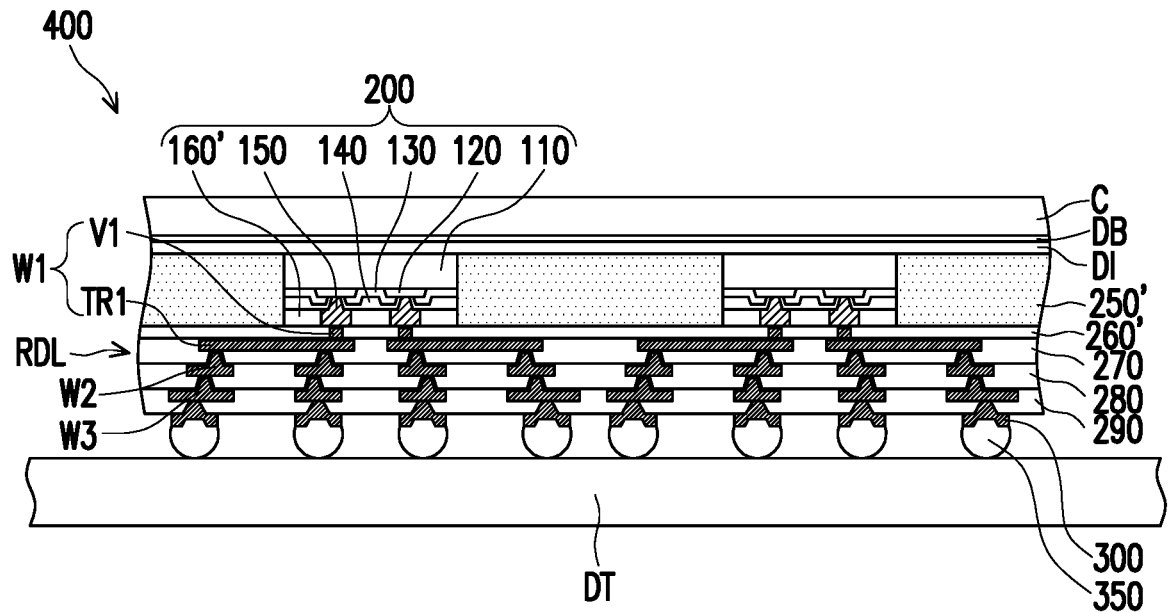
Figure 1R:
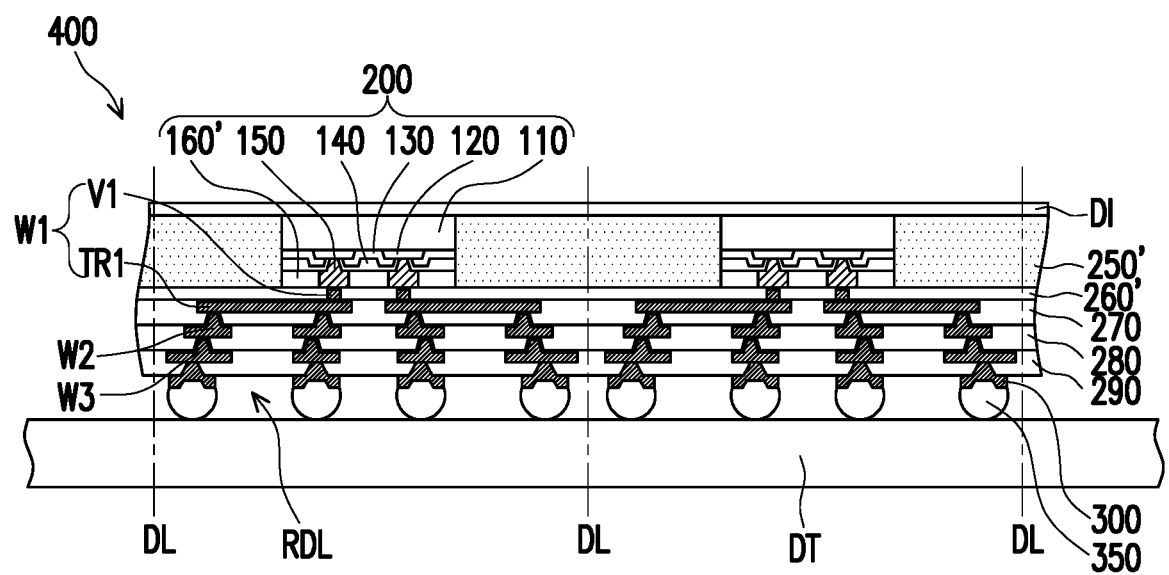
Figure 1S:
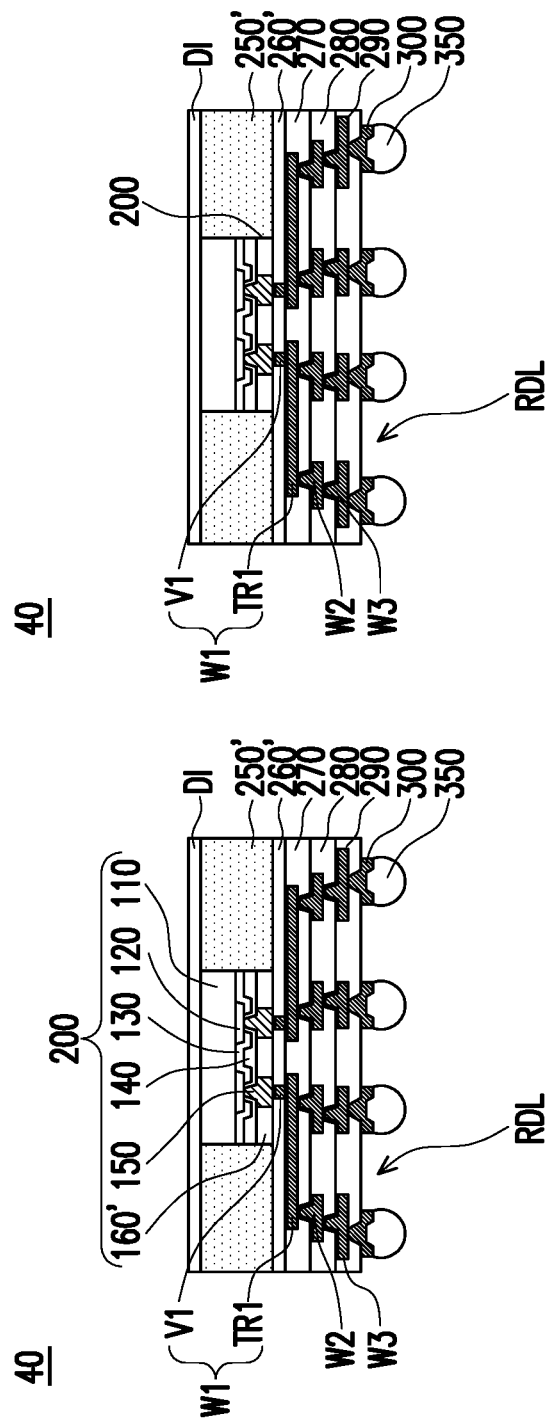

FIG. 1A to FIG. 1S are schematic cross-sectional views illustrating a process flow of manufacturing a semiconductor package in accordance with some embodiments.

Referring to FIG. 1A, a carrier C having a de-bonding layer DB and a dielectric layer DI formed thereon is provided, wherein the de-bonding layer DB is between the carrier C and the dielectric layer DI. In some embodiments, the carrier C is a glass substrate, the de-bonding layer DB includes a light-to-heat conversion (LTHC) release layer formed on the glass substrate. In some embodiments, the dielectric layer DI includes a buffer layer and the material of the buffer layer includes polyimide (PI), polybenzoxazole (PBO), benzocyclobutene (BCB), or any other suitable polymer-based dielectric material. In some embodiments, the buffer layer may be an Ajinomoto Buildup Film (ABF), a solder resist film, or the like.

Referring to FIG. 1B, after the carrier C having the de-bonding layer DB and the dielectric layer DI formed thereon is provided, a plurality of semiconductor dies 200 is picked and placed on the dielectric layer DI. In some embodiments, each of the semiconductor dies 200 may include a semiconductor substrate 110, a plurality of conductive pads 120 formed on the semiconductor substrate 110, a passivation layer 130 and a post-passivation layer 140 formed covering the conductive pads 120, a plurality of conductive pillars 150 formed on the conductive pads 120, and a protection layer 160 formed on the post passivation layer 140 so as to cover the conductive pillars 150. For example, the semiconductor substrate 110 may be a silicon substrate including active components (e.g., transistors or the like) and passive components (e.g., resistors, capacitors, inductors or the like) formed therein and an interconnection structure formed on the silicon substrate. The conductive pads 120 may be aluminum pads, copper pads or other suitable metal pads. The passivation layer 130 may be a silicon oxide layer, a silicon nitride layer, a silicon oxy-nitride layer or a dielectric layer formed by other suitable dielectric materials, while the post passivation layer 140 may be a polyimide (PI) layer, a polybenzoxazole (PBO) layer, or a dielectric layer formed by other suitable polymers, for example. The passivation layer 130 and the post passivation layer 140 may be regarded as a composite passivation layer. Alternatively, the composite passivation layer may be replaced by a single passivation layer. The conductive pillars 150 may be copper pillars or other suitable metal pillars, and the protection layer 160 may be a PBO layer, a polyimide layer or other suitable polymeric material layer.

As shown in FIG. 1B, in some embodiments, the semiconductor dies 200 are placed on the carrier C and are attached or adhered on the dielectric layer DI through a die attach film (not shown), an adhesion paste or the like. In some embodiments, the semiconductor dies 200 placed on the dielectric layer DI may be arranged in an array.

Referring to FIG. 1C, an insulating material 250 is formed on the dielectric layer DI to cover the semiconductor dies 200. In some embodiments, the insulating material 250 is a molding compound formed by a molding process. As shown in FIG. 1C, the protection layers 160 of the semiconductor dies 200 are covered by the insulating material 250. In other words, the protection layers 160 of the semiconductor dies 200 are not revealed and are well protected by the insulating material 250. In some embodiments, the insulating material 250 includes epoxy resins or other suitable resin materials.

Referring to FIG. 1D, a planarization process is performed to remove the insulating material 250 and the protection layers 160 until top surfaces 150a of the conductive pillars 150 are exposed. In some embodiments, the planarization process is performed by performing a mechanical grinding process and/or a chemical mechanical polishing (CMP) process. After the insulating material 250 is polished or ground, an insulating encapsulation 250' is formed over the dielectric layer DI to laterally encapsulate the semiconductor dies 200. During the planarization process, not only the insulating material 250 is removed, portions of the protection layers 160 above the top surfaces 150a of the conductive pillars 150 are also removed to form planarized protection layers 160'.

As shown in FIG. 1D, the insulating encapsulation 250' wraps and surrounds sidewalls of the semiconductor dies 200. That is to say, the semiconductor dies 200 are laterally encapsulated by the insulating encapsulant 250'. In other words, the semiconductor dies 200 are embedded in the insulating encapsulant 250'. It should be noted that, top surfaces 150a of the conductive pillars 150 and top surfaces 160a of the protection layers 160' are substantially coplanar with a top surface 250a of the insulating encapsulant 250'.

Referring to FIG. 1E through FIG. 1O, after the insulating encapsulant 250' is formed, a redistribution circuit structure RDL electrically connected to the conductive pillars 150 of the semiconductor dies 200 is formed on the top surface 250a of the insulating encapsulant 250', the top surfaces 150a of the conductive pillars 150, and the top surfaces 160a of the protection layers 160'. The redistribution circuit structure RDL is fabricated to electrically connect to one or more connectors underneath. Here, the afore-said connectors may be the conductive pillars 150 of the semiconductor dies 200. The redistribution circuit structure RDL is described in detail in the following discussion.

The following descriptions are focused on a manufacturing method of the redistribution circuit structure RDL in accordance with FIG. 1E through FIG. 1O.

Referring to FIG. 1E, a first seed layer SD1 is formed on the insulating encapsulant 250' and the semiconductor dies 200. In some embodiments, the first seed layer SD1 is formed blankety covering the top surface 250a of the insulating encapsulant 250', the top surfaces 150a of the conductive pillars 150, and the top surface 160a of the protection layer 160'. In some embodiments, the first seed layer SD1 may be a metal seed layer, including a titanium/copper (Ti/Cu) composite layer or other metal or metallic layers. A method of forming the first seed layer SD1 may include physical vapor deposition (PVD) such as sputtering, chemical vapor deposition (CVD) or other suitable processes, but the disclosure is not limited thereto.

Still referring to FIG. 1E, after the first seed layer SD1 is formed on the insulating encapsulant 250' and the semiconductor dies 200, a photosensitive mask pattern PM is formed over the first seed layer SD1. In some embodiments, the formation of the photosensitive mask pattern PM includes forming a photosensitive material layer (not shown) on the first seed layer SD1. The photosensitive material layer may be formed by spin coating, printing, deposition or lamination. Additionally, a baking process or a curing process is usually followed. In some embodiments, the photosensitive material layer includes a positive photoresist material. In other embodiments, the photosensitive material layer includes a negative photoresist material. In some embodiments, the material of the photosensitive material layer includes a photosensitive material having high resolution and a good pattern contrast. Critical dimension (CD) is a main measure of resolution, and the smaller the critical dimension is, the higher the resolution is. For example, the photosensitive material has a high resolution or a small critical dimension (CD) about 5 microns or smaller than 5 microns. In one embodiment, the photosensitive material has a CD smaller than 3 microns or ranging from about 0.1 microns to about 3 microns. In some embodiments, a material of the photosensitive material includes Novolac resins (such as phenol formaldehyde resin), acrylate resins, and/or epoxy resins. After forming the photosensitive material layer, a photomask (not shown) is applied and an exposure process is performed to expose portions of the photosensitive material layer to an energy beam or a light. Subsequently, a development process is performed to remove the exposed portions to form the photosensitive mask pattern PM. For example, a developer solution may be applied or sprayed to remove the unreacted portions of the photosensitive material layer. In one embodiment, the developer solution includes alkali developer. In one embodiment, the pattern definition capability of the photosensitive material layer can reach a few microns or even sub-microns scale, which results in a critical dimension (minimum feature size) of the photosensitive mask pattern PM as small as a few microns or even sub-microns. That is, the photosensitive mask pattern PM is a high-resolution photosensitive material pattern with a CD smaller than 5 microns. In one embodiment, the photosensitive mask pattern PM is a high-resolution photosensitive material pattern with a CD even smaller than 3 microns.

In some embodiments, after development, the photosensitive mask pattern PM is patterned to have a plurality of openings S1 revealing portions of the first seed layer SD1 that are located right above and corresponding to the conductive pillars 150. Referring to FIG. 1E, as seen in the schematic enlarged view showing a portion of the photosensitive mask pattern PM including the openings S1, the opening S1 has substantially vertical sidewalls S1W (substantially perpendicular to the top surface 250a of the planarized insulating encapsulant 250'), as the photosensitive material of the photosensitive mask pattern PM has high resolution and pattern contrast. In some embodiments, the openings S1 of the photosensitive mask pattern PM have a width less than 3 μm and an aspect ratio ranging from 1 to 2. In some alternative embodiments, the openings S1 of the photosensitive mask pattern PM may have a width of about 2-3 microns and an aspect ratio ranging from 1 to 10. For example, the photosensitive mask pattern PM has more than one opening and some openings of the openings are via openings having a size approaching the critical dimension (also called critical dimension openings).

Referring to FIG. 1F and FIG. 1G, after forming the photosensitive mask pattern PM having the via openings on the first seed layer SD1, a plurality of metal vias M1 is formed within the openings S1 filling up the openings S1. For example, the metal vias M1 are formed on the first seed layer SD1 exposed by the via openings S1 of the photosensitive mask pattern PM by plating. For example, through the first seed layer SD1 exposed by the openings S1, the structure including the semiconductor dies 200, the insulating encapsulant 250', the first seed layer SD1, and the photosensitive mask pattern PM is immersed in a plating bath such that the metal vias M1 are plated on the portions of the first seed layer SD1 revealed by the via openings of the photosensitive mask pattern PM.

After plating the metal vias M1, as shown in FIG. 1G, the photosensitive mask pattern PM is removed or stripped. In some embodiments, the photosensitive mask pattern PM is removed by plasma etching. In some embodiments, the photosensitive mask pattern PM is removed by isotropic etching. Thereafter, as seen in FIG. 1G, portions of the first seed layer SD1 that are not covered by the metal vias M1 may be removed until the insulating encapsulant 250', the conductive pillars 150, and the protection layers 160' are revealed, for example. In one embodiment, the undesired seed layer SD1 is removed by anisotropic etching. After removing the uncovered seed layer, in some embodiments, the metal vias M1 and the underlying first seed layers SD1 may be referred to as vias V1. In other words, the vias V1 are formed directly on the conductive pillars 150. In some embodiments, the material of the metal vias M1 includes copper or copper alloys, but the disclosure is not limited thereto.

Still referring to FIG. 1F and FIG. 1G, since the vias V1 are respectively formed within and filling up the via openings S1 of the photosensitive mask pattern PM, a width and an aspect ratio of the vias V1 substantially follows the width and the aspect ratio of the via openings S1 of the photosensitive mask pattern PM. The vias V1 may be slightly protruded from the openings S1 or substantially co-levelled with the top surface of the photosensitive mask pattern. That is to say, in some embodiments, the vias V1 have a width less than 3 μm and an aspect ratio ranging from 1 to 2. In some alternative embodiments, the vias V1 may have a width of about 2-3 microns and an aspect ratio ranging from about 1 to about 10. In other words, the vias V1 are of relatively small sizes. In addition, by using the photosensitive mask pattern PM, small-sized via openings are achievable due to the applied photosensitive material having high resolution and high pattern contrast properties. Furthermore, as the photosensitive material used for the photosensitive mask pattern PM is a high-resolution (CD smaller than 3 microns) photosensitive material, the thickness of the photosensitive mask pattern PM is not necessarily thick, which is beneficial for forming small size vias and fine line/space features.

In some embodiments, as seen in FIG. 1G, the vias V1 are located on the conductive pillars 150 of the semiconductor dies 200 and physically contact the conductive pillars 150. As shown in a schematic enlarged top view of FIG. 1G illustrating a region where one via V1 is formed on the top surface 150a of one conductive pillar 150, in some embodiments, the via V1 is fully-landed on the conductive pillar 150, i.e. the whole via V1 is formed within the span region of the top surface 150a of the conductive pillar 150. In some embodiments, the conductive pillars 150 may have a diameter of d1 of about 20-30 μm, for example. In some embodiments, the vias V1 have a diameter d2 less than 5 μm. That is to say, from the top view, the projection of the via V1 along the thickness direction falls totally within the span of the conductive pillar 150. Taking the conductive pillar and via having round cross-sectional shapes as examples, the via V1 may be located at a center of the top surface 150a of the conductive pillar 150 (similar to concentric circles, as seen in the enlarged top view of FIG. 1G). In other embodiments, the via V1 may be located near the center of the top surface 150a of the conductive pillar 150 or even shifted aside but not beyond the span of the conductive pillar 150 (similar to eccentric circles from the top view). In certain embodiments, a diameter ratio (size ratio) of the via V1 and the conductive pillar 150 is about 1:1.2 to about 1:10. It is understood that the cross-sectional shapes of the vias V1 or the conductive pillars 150 are not limited to be round shapes but may be tetragonal, hexagonal, octagonal or any suitable polygonal shapes, and the configurations of the vias V1 or the conductive pillars 150 are not limited by the embodiments described herein.

In some embodiments, the formation of vias of smaller sizes leads to a larger process window for the via openings, especially for the alignment of the via openings toward the underlying conductive pillars. Better alignment leads to less via shifting (location shifting of the via) relative to the underlying conductive pillar. Hence, an overlay tolerance of the via relative to the underlying conductive pillar for subsequent via formations is also improved. For example, for shrinking the size of the via opening to a half, the tolerance is improved at least 50% more. In other words, the smaller the ratio of via size to the pillar size, the greater the overlay tolerance of the via(s).

Referring to FIG. 1H, after the vias V1 are formed on the conductive pillars 150, a first dielectric material 260 is formed on the insulating encapsulant 250', the conductive pillars 150, and the protection layers 160' and covers the vias V1. In some embodiments, the first dielectric material 260 is thick enough to fully cover the vias V1 without exposing the vias V1. In some embodiments, the first dielectric material 260 may be formed of a polymeric material including polyimide, PBO or BCB. The first dielectric material 260 may be formed by a suitable fabrication technique such as spin-coating, lamination, deposition, or the like.

Referring to FIG. 1I, following the formation of the first dielectric material 260, another planarization process is then performed to remove a portion of the first dielectric material 260 until the tops of the vias V1 are revealed, such that the vias V1 are embedded in a first dielectric layer 260'. In some embodiments, the planarization process may include a mechanical grinding process and/or a chemical mechanical polishing (CMP) process, but the disclosure is not limited thereto.

As shown in FIG. 1I, after the planarization process is performed, the tops of the vias V1 are revealed from the first dielectric layer 260'. In some embodiments, portions of the vias V1 may also be removed during the planarization process.

Referring to FIG. 1J, a second seed layer SD2 is formed over the first dielectric layer 260' covering the vias V1. In some embodiments, the second seed layer SD2 may be a metal seed layer, including a titanium/copper (Ti/Cu) composite layer or other metal or metallic layers. In some embodiments, the material of the first seed layer may be the same as the material of the second seed layer. In some embodiments, the material of the first seed layer may be different from the material of the second seed layer. Fabrication methods similar to the fabrication methods for forming the first seed layer may be used, and the details are omitted herein.

As shown in FIG. 1J, after the second seed layer SD2 is formed, a patterned photoresist PR is formed on the second seed layer SD2, wherein the patterned photoresist PR has a plurality of openings S2 revealing portions of the second seed layer SD2. For example, the openings S2 may have a size larger than the size of the vias V1 and the locations of the openings S2 correspond to the locations of the vias V1 so that the underlying vias are located within the span of the openings S2. In some embodiments, the openings S2 are considered as routing openings used for defining the patterns for routing lines and traces. The patterned photoresist PR may be a positive tone photoresist or a negative tone photoresist, but the disclosure is not limited thereto.

Referring to FIG. 1K and FIG. 1L, metal patterns M2 are formed on portions of the second seed layer SD2 exposed by the openings S2 of the patterned photoresist PR. The metal patterns are formed by plating, for example. In some embodiments, the material of the metal patterns M2 includes copper, copper alloys or any suitable metal materials. After forming the metal patterns M2, the patterned photoresist PR is stripped. Thereafter, portions of the second seed layer SD2 that are not covered by the metal patterns M2 are removed through etching until first dielectric layer 260' is revealed, for example. In certain embodiments, as the seed layer is relatively thin, the patterned seed layer SD2 underlying the metal patterns M2 are considered part of the metal patterns M2.

In some embodiments, the metal patterns M2 and the underlying second seed layers SD2 may be referred to as traces TR1 (functioning as routing lines or traces connected with vias V1). In other words, the traces TR1 formed on the first dielectric layer 260' are physically and electrically connected with the vias V1. Since the traces TR1 are in physical and electrical contacts with the vias V1, the traces TR1 and the vias V1 may be referred to as first conductive wirings W1, and the first conductive wirings W1 are electrically connected to the conductive pillars 150 of the semiconductor dies 200. In some embodiments, the metal patterns M2 may include copper, but the disclosure is not limited thereto.

Referring to FIG. 1M, after the traces TR1 are formed on the vias V1 and the first dielectric layer 260', a second dielectric layer 270 is formed over the first dielectric layer 260' covering the traces TR1. The second dielectric layer 270 includes openings S3 exposing the underlying traces TR1. In some embodiments, the formation method and the material of the second dielectric layer 270 may be the same as those of the first dielectric material, and the second dielectric layer 270 may be patterned by photolithography and etching processes. In some embodiments, the openings S3 of the second dielectric layer 270 have tapered sidewalls and portions of the traces TR1 are revealed by the openings S3.

Referring to FIG. 1N, after the second dielectric layer 270 is formed, a third seed layer SD3 and metal patterns M3 are formed on the second dielectric layer 270. The formation of the third seed layer may include blanketly forming a seed layer on the second dielectric layer 270 to conformally cover the openings S3 of the second dielectric layer 270 and the portions of the first traces TR1 revealed by the openings S3 of the second dielectric layer 270. For example, the third seed layer SD3 covers a top surface of the second dielectric layer 270, sidewalls of the openings S3 and the revealed portions of the traces TR1. In some embodiments, the third seed layer SD3 may be a metal seed layer, and the formation method and the material of the third seed layer SD3 may be similar or the same as the second seed layer SD2, but the disclosure is not limited thereto.

Still referring to FIG. 1N, after the third seed layer SD3 is formed on the second dielectric layer 270, metal patterns M3 are formed on the third seed layer SD3. The formation of the metal patterns M3 includes similar process steps for forming the metal patterns M2, and the detailed descriptions are omitted for brevity.

As shown in FIG. 1N, in some embodiments, the metal patterns M3 and the underlying third seed layer SD3 sandwiched between the second dielectric layer 270 and the metal patterns M3 may be referred to as traces TR2. In some embodiments, portions of the metal patterns M3 (together with the third seed layer SD3) that fill the openings S3 of the second dielectric layer 270 may be referred to as vias V2. In some embodiments, since the vias V2 are formed in the tapered sidewall openings of the second dielectric layer 270, the vias V2 have tapered sidewalls. In some embodiments, the traces TR2 including vias V2 and routing traces may be referred to as second conductive wirings W2, and the second conductive wirings W2 are electrically connected to the first conductive wirings W1.

Referring to FIG. 1O, in some embodiments, the above-mentioned steps as illustrated in FIG. 1M through FIG. 1N may be performed multiple times to fabricate a multi-layered redistribution circuit layer as required by the circuit design. In other words, the redistribution circuit structure RDL may include a plurality of conductive wirings and a plurality of dielectric layers stacked alternately. For example, a third dielectric layer 280 and a third conductive wirings W3 having vias V3 are formed on the second conductive wirings W2. The third conductive wirings, i.e. traces TR3, is formed by forming a fourth seed layer SD4 and metal patterns M4 on the second conductive wirings W2. The third conductive wirings W3 is in physical and electrical contact with the second conductive wirings W2. In some embodiments, a third dielectric layer 280 is formed on the second dielectric layer 270 and the second conductive wirings W2, and a fourth dielectric layer 290 is formed on the third dielectric layer 280 with openings S4 exposing portions of the third conductive wirings W3.

As shown in FIG. 1O, in some embodiments, the fourth dielectric layer 290 has a plurality of openings S4 revealing portions of a topmost conductive wirings (the conductive wirings W3, for example) of the redistribution structure RDL. In some embodiments, the fourth dielectric layer 290 may be referred to as a top passivation layer. In some embodiments, the material of the top passivation layer 290 may include polyimide, PBO, BCB, Ajinomoto Buildup Film (ABF), solder resist, or the like. The patterned passivation layer may be formed by a suitable fabrication technique such as spin-coating, lamination, deposition, or the like.

Referring to FIG. 1P, pads 300 are formed in the openings S4. In some embodiments, the pads 300 are located on the exposed portions of the topmost conductive wirings W3 revealed by the openings S4 of the fourth dielectric layer 290. In some embodiments, the pads 300 may include an under-ball metallurgy (UBM), but the disclosure is not limited thereto. In some alternative embodiments, the pads 300 may include the under-ball metallurgy (UBM) patterns for ball mount and connection pads for mounting of passive components such as resistors, capacitors, inductors or the like. In some embodiments, the pads 300 also covers sidewalls of the openings of the third dielectric layer 290 and extends to partially cover a top surface of the third dielectric layer 290. The pads 300 are physically and electrically connected to the topmost conductive wirings W3 of the redistribution circuit structure RDL. In other words, the pads 300 and the wirings W1, W2, W3 of the redistribution circuit structure RDL are electrically connected to the conductive pillars 150 of the semiconductor dies 200. It is noted that the number of the pads 300 is not limited in the disclosure.

As shown in FIG. 1P, a plurality of conductive balls 350 is formed on the pads 300, and a wafer level packaging structure 400 is obtained. The conductive balls 350 may include copper, aluminum, lead-free alloys (e.g., gold, tin, silver, aluminum, or copper alloys) or lead alloys (e.g., lead-tin alloys). In some embodiments, the conductive balls 350 are placed on the pads 300 by a ball placement process. In some embodiments, the conductive balls 350 include ball grid array bumps, C4 bumps, or solder bumps.

Referring to FIG. 1Q, the wafer-level packaging structure 400 is flipped (turned upside down) and attached or adhered onto a dicing tape DT. In some embodiments, the dicing tape may include PVC, polyolefin, polyethylene, or other suitable materials as long as the material is able to hold the above-mentioned structures.

Referring to FIG. 1R, a de-bonding process is performed such that the carrier C is de-bonded and removed from the wafer-level packaging structure 400. In some embodiments, after removing the carrier C and the de-bonding layer DB, the dielectric layer DI of the wafer-level packaging structure 400 is exposed. In some embodiments, the dielectric layer DI may be removed or ground to reveal the bottom surface of the insulating encapsulant 250', but the disclosure is not limited thereto.

Still referring to FIG. 1R, a dicing process is performed along the dicing lines DL to cut the above-mentioned structures 400 (cutting through the dielectric layer DI, the insulating encapsulant 250', and redistribution circuit structure RDL) into a plurality of individual packages 40. In some embodiments, the dicing process may include a mechanical blade sawing process or laser cutting process.

As shown in FIG. 1S, after the dicing process, the separated packages 40 may each include the dielectric layer DI, the semiconductor die 200 formed on the dielectric layer DI and laterally encapsulated by the insulating encapsulant 250', and the redistribution circuit structure RDL formed on the semiconductor die 200 and electrically connected to the semiconductor die 200, wherein the redistribution circuit structure RDL includes the plurality of conductive wirings W1, W2, W3 and the plurality of dielectric layers 260', 270, 280, 290 stacked alternately. In one embodiment, the package 40 is an integrated fan-out (InFO) package, and the conductive wirings W1 include at least the vias V1 embedded in the dielectric layer 260'.

FIG. 2A to FIG. 2K are schematic cross-sectional views illustrating a process flow for manufacturing a semiconductor package in accordance with some embodiments.

The difference between the embodiments described in FIG. 1A to FIG. 1S and the embodiments described in FIG. 2A to FIG. 2K lies mainly in the formation of some of the conductive vias in the redistribution circuit structure RDL in the integrated fan-out package such that different forming processes are required. Some processes may be substantially the same as or similar to the manufacturing processes of the wafer-level packaging structure 400 and will not be repeated herein for brevity.

Figure 2A:
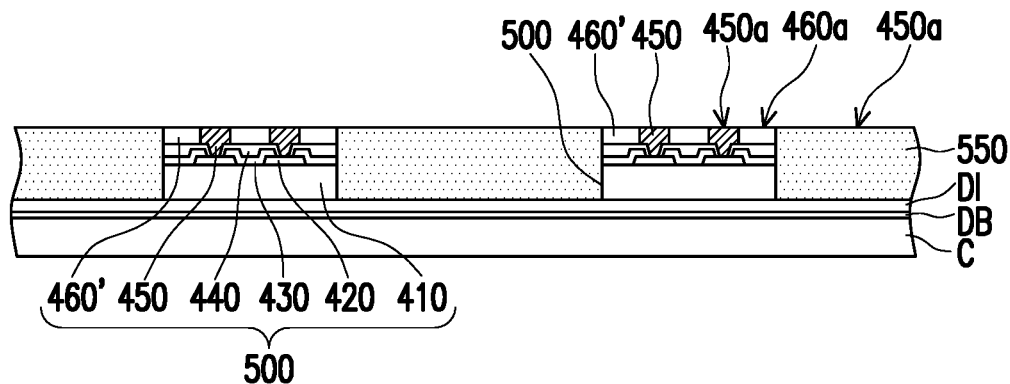
FIG. 2A to FIG. 2K are schematic cross-sectional views illustrating a process flow of manufacturing a semiconductor package in accordance with some embodiments.

Referring to FIG. 2A, a carrier C having a de-bonding layer DB and a dielectric layer DI formed thereon is provided, and two or more semiconductor dies 500 are disposed on the dielectric layer DI over the carrier C. Later, an insulating encapsulant 550 is formed over the carrier C wrapping around the semiconductor dies 500. For example, the insulating encapsulation 550 at least wraps and surrounds sidewalls of the semiconductor dies 500. That is to say, the semiconductor dies 500 are laterally encapsulated by the insulating encapsulant 550, and are embedded in the insulating encapsulant 550. The formation of the insulating encapsulant 550 may include performing a grinding process or a CMP process. In some embodiments, top surfaces 450a of the conductive pillars 450 and top surfaces 460a of the protection layers 460' are substantially coplanar with a top surface 550a of the insulating encapsulant 550.

Referring to FIG. 2B through FIG. 2I, after the insulating encapsulant 550 is formed, a redistribution circuit structure RDL electrically connected to the conductive pillars 450 of the semiconductor dies 500 is formed on the top surface 550a of the insulating encapsulant 550, the top surfaces 450a of the conductive pillars 450, and the top surfaces 460a of the protection layers 460'. The redistribution circuit structure RDL is fabricated to electrically connect to one or more connectors underneath. Here, the afore-said connectors may be the conductive pillars 450 of the semiconductor dies 500. The redistribution circuit structure RDL is described in detail in the following discussion.

The following descriptions are focused on a manufacturing method of the redistribution circuit structure RDL in accordance with FIG. 2B through FIG. 2I.

Figure 2B:
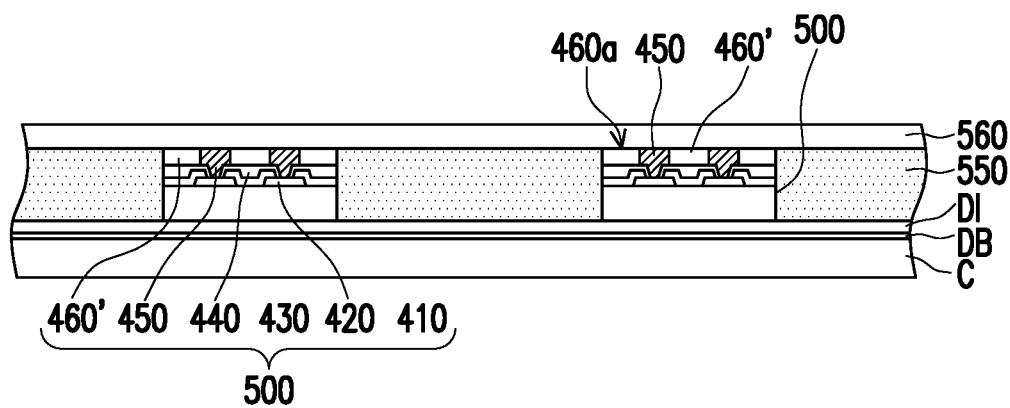

Referring to FIG. 2B, a first dielectric material 560 is formed on the insulating encapsulant 550 and the semiconductor dies 500. That is, the first dielectric material 560 is formed to conformally cover the top surface 550a of the insulating encapsulant 550, the top surfaces 450a of the conductive pillars 450, and the top surfaces 460a of the protection layers 460'. In some embodiments, the first dielectric material 560 may be formed of a polymeric material including polyimide, PBO or BCB. The first dielectric material 560 may be formed by a suitable fabrication technique such as spin-coating, lamination, deposition, or the like.

Figure 2C:
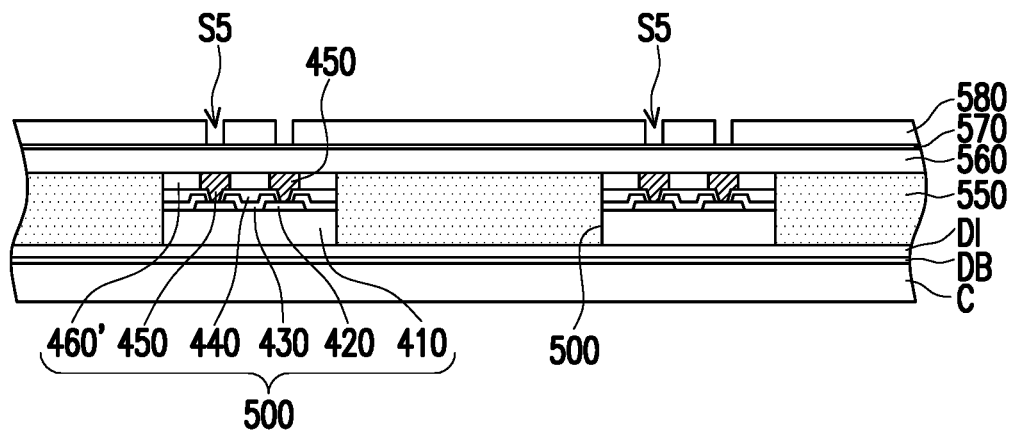

Referring to FIG. 2C, after the first dielectric material 560 is formed on the insulating encapsulant 550 and the semiconductor dies 500, a hard mask 570 is formed on the first dielectric material 560. In some embodiments, the hard mask 570 is blanketly formed covering the first dielectric material 560. In some embodiments, the hard mask 570 may be a metal layer or a metal composite layer, such as a titanium/copper (Ti/Cu) composite layer, or other metal/metallic layers. A method of forming the hard mask 570 may include physical vapor deposition (PVD) such as sputtering, chemical vapor deposition (CVD) or other suitable processes, but the disclosure is not limited thereto.

Still referring to FIG. 2C, after the hard mask 570 is formed on the first dielectric material 560, a photosensitive mask pattern 580 is formed on the hard mask 570. In some embodiments, the formation of the photosensitive mask pattern 580 includes forming a photosensitive material layer (not shown) on the hard mask 570. The photosensitive material layer may be formed by spin coating, printing, deposition or lamination. Additionally, a baking process or a curing process is usually followed. In some embodiments, the photosensitive material layer includes a positive photoresist material. In other embodiments, the photosensitive material layer includes a negative photoresist material. In some embodiments, the material of the photosensitive material layer includes a photosensitive material having high resolution and a good pattern contrast. For example, the photosensitive material has a high resolution or a small critical dimension (CD) about 5 microns or smaller than 5 microns. In one embodiment, the photosensitive material has a CD smaller than 3 microns or ranging from about 0.1 microns to about 3 microns. In some embodiments, a material of the photosensitive material includes Novolac resins (i.e. phenol formaldehyde resin), acrylate resins, and/or epoxy resins. After an exposure process is performed to expose portions of the photosensitive material layer to an energy beam or a light, and a development process is performed to remove the exposed portions, the photosensitive mask pattern 580 may be formed. For example, a developer solution may be applied or sprayed to remove the unreacted portions of the photosensitive material layer. In one embodiment, the developer solution includes alkali developer. In one embodiment, the pattern definition capability of the photosensitive material layer can reach a few microns or even sub-microns scale, which results in a critical dimension (minimum feature size) of the photosensitive mask pattern 580 as small as a few microns or even sub-microns. That is, the photosensitive mask pattern 580 is a high-resolution photosensitive material pattern having a CD smaller than 5 microns. In one embodiment, the photosensitive mask pattern 580 is a high-resolution photosensitive material pattern having a CD smaller than 3 microns. Herein, the material used for the photosensitive mask pattern 580 may be different from the material used for the photosensitive mask pattern PM.

In alternative embodiments, the material used for the photosensitive mask pattern 580 may be the same as the material used for the photosensitive mask pattern PM.

In some embodiments, after development, the photosensitive material layer is patterned to have a plurality of openings S5 revealing portions of the hard mask 570 that are located right above and corresponding to the conductive pillars 450. In some embodiments, the openings S5 of the photosensitive mask pattern 580 have a width less than 5 μm. In some alternative embodiments, the openings S5 of the photosensitive mask pattern 580 may have a width of about 2-3 microns.

Figure 2D:
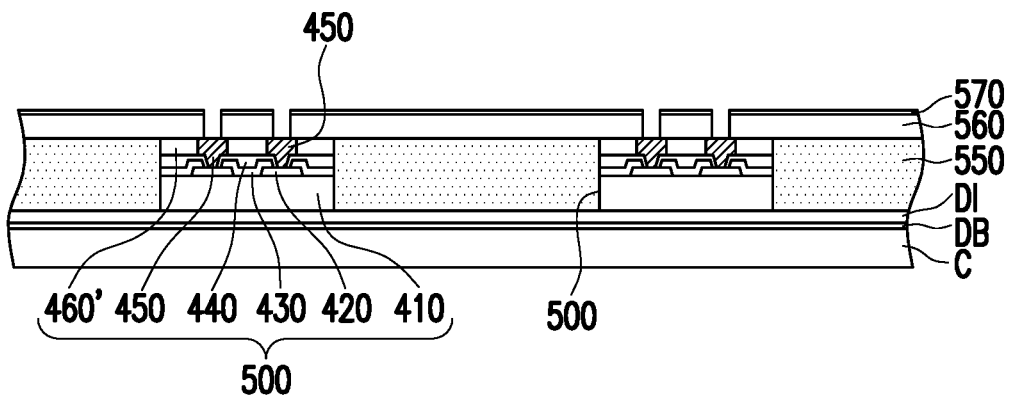

Referring to FIG. 2D, after forming the photosensitive mask pattern 580 having the openings S5 on the first dielectric material 560, an etching process is then performed through the via openings S5 to remove the exposed portions of the hard mask 570 and the underlying first dielectric material 560 until the conductive pillars 450 are revealed. In some embodiments, more than one etching processes are performed, but the disclosure is not limited thereto as long as the etching process is sufficient to remove the exposed portions of the hard mask 570 and the portions of the first dielectric material 560 corresponding to the locations of the openings S5 so as to expose the conductive pillars 450. In some embodiments, the etching process may include one or more plasma etching processes. The plasma used in the etching process may include $O_2$ plasma, $CF_4$ plasma, $SF_6$ plasma, or combinations thereof. In some embodiments, due to etching selectivity of the hard mask 570 and the first dielectric material 560, the hard mask 570 may be etched by anisotropic etching using a first etchant and the first dielectric material 560 may be etched by anisotropic etching using a second etchant different from the first etchant.

Figure 2E:
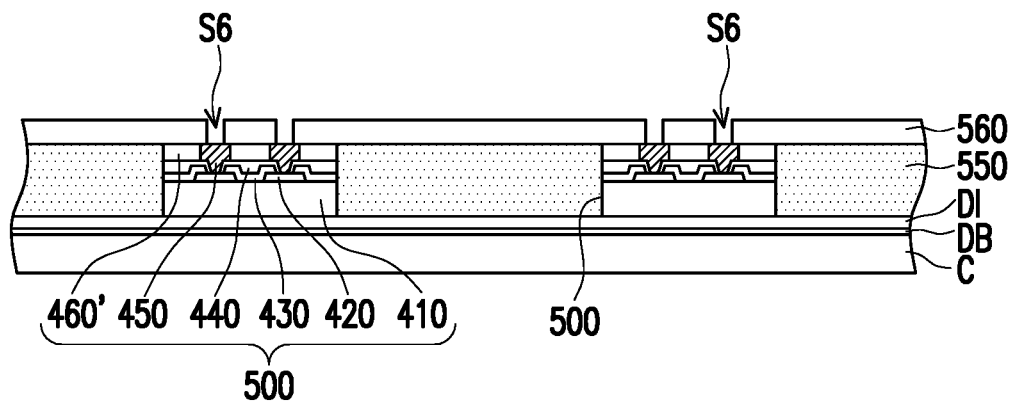

Referring to FIG. 2D and FIG. 2E, during the etching process, photosensitive mask pattern 580 may be simultaneously removed until the underlying hard mask 570 is exposed. The formation of the hard mask 570 may be used to ensure the removal of the photosensitive mask pattern 580 does not damage the underlying first dielectric material 560 or cause over-etching or undercut to the underlying first dielectric material 560. In alternative embodiments, the photosensitive mask pattern 580 may be separately removed by plasma etching or stripped by wet etching. Later, the hard mask 570 is removed by isotropic etching or anisotropic etching. After removing the photosensitive mask pattern 580 and the hard mask 570, a first dielectric layer 560 is formed on the insulating encapsulant 550, the conductive pillars 450, and the protection layers 460', wherein the first dielectric layer 560 has openings S6 revealing portions of the conductive pillars 450 that are located right above and corresponding to the conductive pillars 450. Since the openings S6 of the first dielectric layer 560 are well defined and fully corresponded to the openings S5 of the photosensitive mask pattern 580, the openings S6 of the first dielectric layer 560 have the same dimensions and configurations corresponding to those of the openings S5 of the photosensitive mask pattern 580. That is, the openings S6 have very high pattern fidelity relative to the openings S5 of the photosensitive mask pattern 580. As the photosensitive mask pattern 580 is a high-resolution mask pattern having openings S5 (or features) of small critical dimensions, the openings S6 are deem to have small critical dimensions. In some embodiments, the openings S6 have a width less than 3 μm and an aspect ratio ranging from about 1 to about 10. In some alternative embodiments, the openings S6 of the first dielectric layer 560 may have a width of about 1-2 microns and an aspect ratio ranging from about 1 to about 10. For example, the first dielectric layer 560 has more than one opening and some openings of the openings are via openings having a size approaching the critical dimension (also called critical dimension openings).

Herein, by using the photosensitive mask pattern 580 together with the underlying hard mask 570, small-sized via openings S6 are obtainable in the underlying dielectric material layer. Furthermore, the photosensitive mask pattern 580 and the underlying hard mask 570 are beneficial for forming small-sized openings with large aspect ratios in the underlying dielectric material layer, as the hard mask 570 can protects the underlying dielectric material from being over-etched and ensure the size of the formed openings follow the above mask patterns.

Figure 2F:
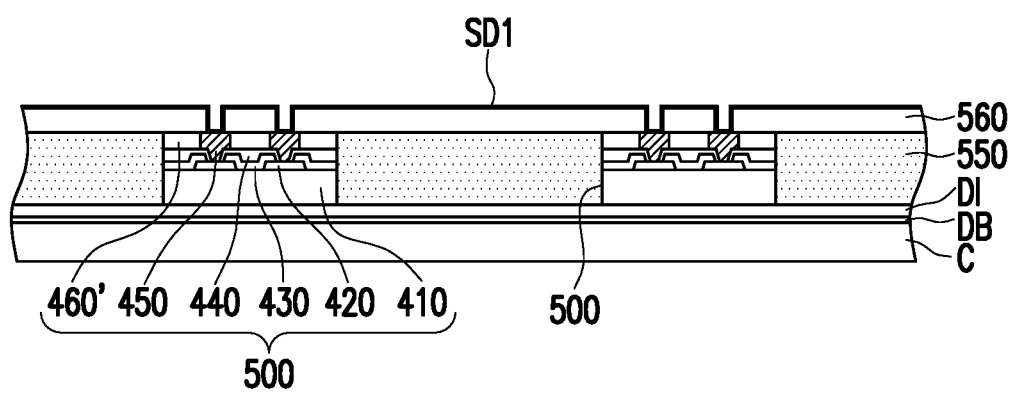

Referring to FIG. 2F, after the first dielectric layer 560 having the via openings S6 is formed, a first seed layer SD1 is formed on the first dielectric layer 560 to conformally cover the first dielectric layer 560 and the portions of the conductive pillars 450 revealed by the via openings of the first dielectric layer 560. For example, the first seed layer SD1 covers sidewalls and a top surface of the first dielectric layer 560 and portions of the top surfaces of the conductive pillars 450. In some embodiments, the first seed layer SD1 may be a metal seed layer, including a titanium/copper (Ti/Cu) composite layer or other metal or metallic layers. A method of forming the first seed layer SD1 may include sputtering, CVD or other suitable processes, but the disclosure is not limited thereto.

Figure 2G:
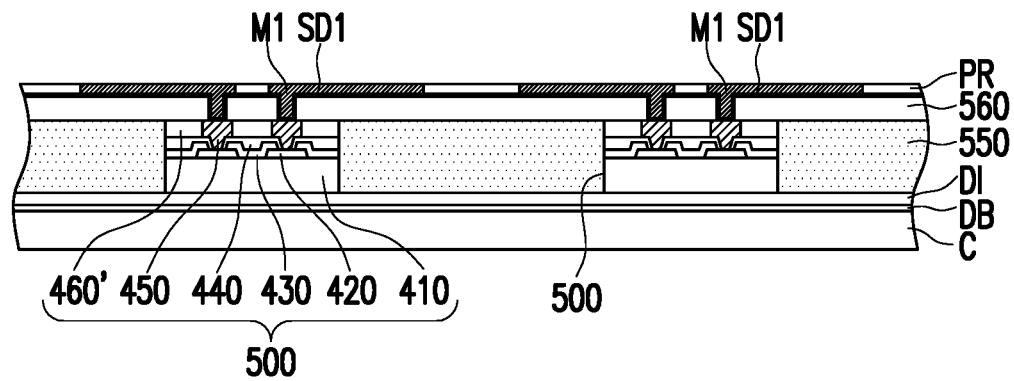
Figure 2H:
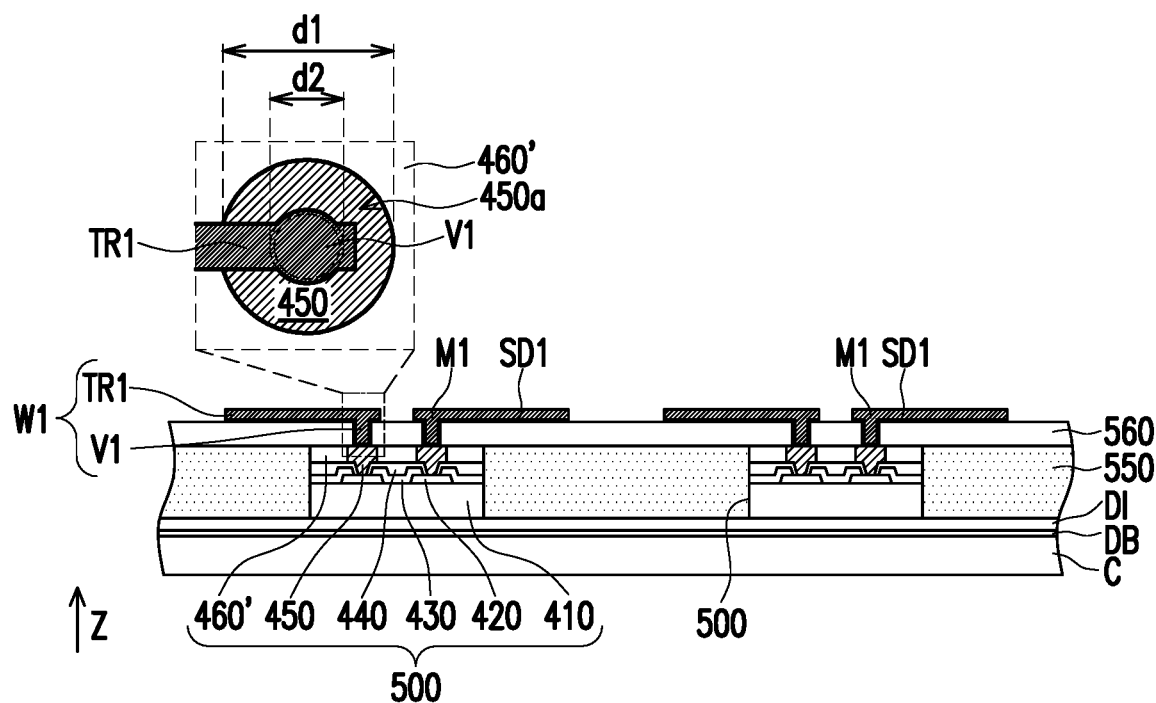

Referring to FIG. 2G and FIG. 2H, after the first seed layer SD1 is formed on the first dielectric layer 560, a patterned photoresist PR is formed on the first seed layer SD1, wherein the patterned photoresist PR has a plurality of openings revealing portions of the first seed layer SD1 that are located right above and corresponding to the conductive pillars 450. In some embodiments, the openings of patterned photoresist PR may have a size larger than the size of the via openings and the locations of the openings of patterned photoresist PR correspond to the locations of the via openings so that the underlying via openings are located within the span of the openings of patterned photoresist PR. For example, the patterned photoresist PR may be positive tone photoresist or negative tone photoresist, but the disclosure is not limited thereto.

Thereafter, a plurality of metal patterns M1 is formed on the exposed portions of first seed layer SD1, filling up the via openings S6 of first dielectric layer 560 and the openings of the patterned photoresist PR. The metal patterns M1 are formed by plating, for example. In some embodiments, the material of the metal patterns M1 includes copper, copper alloys or any suitable metal materials. After forming the metal patterns M1 on the portions of the first seed layer SD1 revealed by the openings of the patterned photoresist PR, the patterned photoresist PR is stripped. Thereafter, portions of the first seed layer SD1 that are not covered by the metal patterns M1 are removed by etching, so that the first dielectric layer 560 is revealed. In certain embodiments, as the seed layer is relatively thin, the patterned seed layer SD1 underlying the metal patterns M1 are considered part of the metal patterns M1.

As shown in FIG. 2H, in some embodiments, portions of the metal patterns M1 and the underlying and surrounding first seed layer SD1 that fill up the via openings of the first dielectric material 560 may be referred to as vias V1, and portions of the metal patterns M1 and the underlying first seed layer SD1 formed on top surfaces of the first dielectric layer 560 may be referred to as traces TR1 (functioning as routing lines or traces connected with vias V1). In other words, the metal patterns M1 including the portions of the traces TR1 and the portions of the vias V1 are formed at the same time in the same process. The traces TR1 formed on the first dielectric layer 560 are physically and electrically connected with the vias V1. The traces TR1 and the vias V1 may be referred to as first conductive wirings W1, and the first conductive wirings W1 are physically and electrically connected to the conductive pillars 450 of the semiconductor dies 500. In some embodiments, the metal patterns M1 may include copper or copper alloys, but the disclosure is not limited thereto.

Still referring to FIG. 2G and FIG. 2H, since the vias V1 are formed within and filling up the via openings of the first dielectric layer 560 respectively, the width and the aspect ratio of the vias V1 substantially follows the width and the aspect ratio of the via openings S6 of the first dielectric layer 560. In some embodiments, the vias V1 have a width less than 3 µm and an aspect ratio ranging from about 1 to about 10. In some alternative embodiments, the vias V1 may have a width of about 1-2 microns and an aspect ratio ranging from about 1 to about 10. In other words, the vias V1 are of relatively small sizes and relatively high aspect ratios.

In some embodiments, as seen in FIG. 2H, the vias V1 are located on the conductive pillars 150 of the semiconductor dies 500 and physically contact the conductive pillars 450. As shown in a schematic enlarged top view of FIG. 2H illustrating a region where one via V1 is formed on the top surface 450a of one conductive pillar 450. In some embodiments, the via V1 is fully-landed on the conductive pillar 450, i.e. the whole via V1 is formed within the span region of the top surface 450a of the conductive pillar 450. In some embodiments, the conductive pillars 450 may have a diameter of d1 of about 20-30 µm, for example. In some embodiments, the vias V1 have a diameter d2 less than 5 µm. That is to say, from the top view, the projection of the via V1 along the thickness direction falls totally within the span of the conductive pillar 450. Taking the conductive pillar and via having round cross-sectional shapes as examples, the via V1 may be located at a center of the top surface 450a of the conductive pillar 450 (similar to concentric circles, as seen in the enlarged top view of FIG. 2H). In other embodiments, the via V1 may be located near the center of the top surface 450a of the conductive pillar 450 or even shifted aside but not beyond the span of the conductive pillar 450 (similar to eccentric circles from the top view). In certain embodiments, a diameter ratio (size ratio) of the via V1 and the conductive pillar 450 is about 1:1.2 to about 1:10. It is understood that the cross-sectional shapes of the vias V1 or the conductive pillars 450 are not limited to be round shapes but may be tetragonal, hexagonal, octagonal or any suitable polygonal shapes, and the configurations of the vias V1 or the conductive pillars 450 are not limited by the embodiments described herein.

In some embodiments, the formation of smaller sized vias leads to a larger process window for the via openings, especially for the alignment of the via openings toward the underlying conductive pillars. Better alignment leads to less via shifting (location shifting of the via) relative to the underlying conductive pillar. Hence, an overlay tolerance of the via relative to the underlying conductive pillar for subsequent via formations is also improved. For example, for shrinking the size of the via opening to a half, the tolerance is improved at least 50% more. In other words, the smaller the ratio of via size to the pillar size, the greater the overlay tolerance of the via(s). In addition, less polishing process or CMP process is needed as the traces and vias are formed in a single process.

Figure 2I:
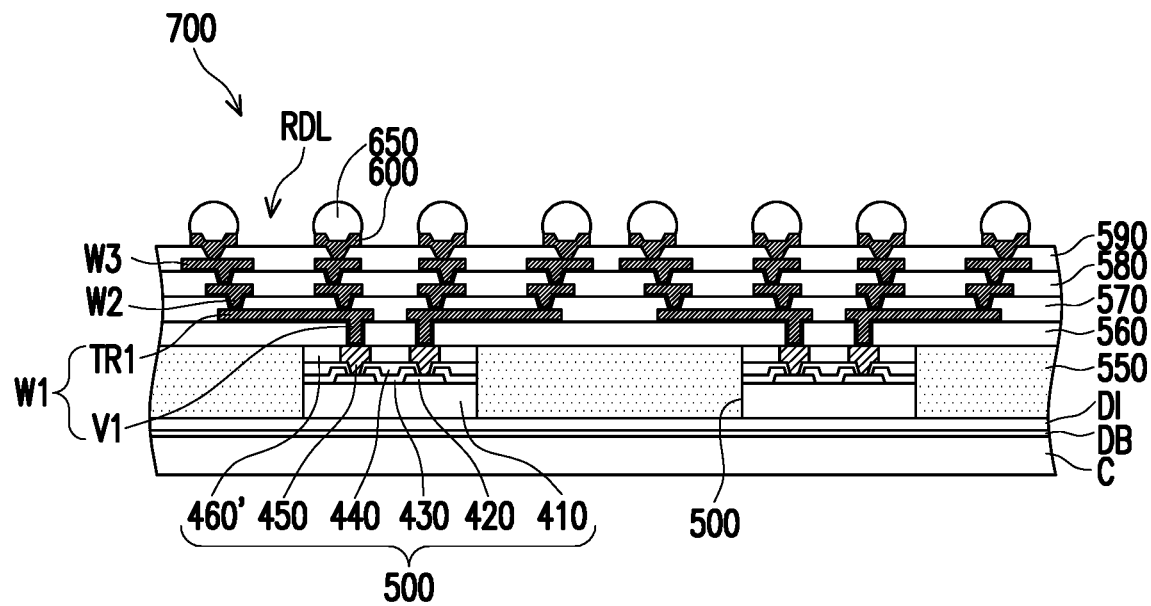

Referring to FIG. 2I, in some embodiments, the above-mentioned steps as illustrated in FIG. 1M through FIG. 1P may be performed multiple times to fabricate a multi-layered redistribution circuit layer as required by the circuit design, and the detailed descriptions are omitted for brevity. In other words, the redistribution circuit structure RDL may include a plurality of conductive wirings W1, W2, W3 and a plurality of dielectric layers 560, 570, 580, 590 stacked alternately. For example, the third conductive wirings W3 are in physical and electrical contacts with the second conductive wirings W2, and the second conductive wirings W2 are in physical and electrical contacts with the first conductive wirings W1. In addition, a plurality of pads 600 are formed in the openings of the dielectric layer 590. The pads 600 are physically and electrically connected to the topmost conductive wirings W3 of the redistribution circuit structure RDL. In other words, the pads 600 and the wirings W1, W2, W3 of the redistribution circuit structure RDL are electrically connected to the conductive pillars 450 of the semiconductor dies 500. It is noted that the number of the pads 600 is not limited in the disclosure. Thereafter, a plurality of conductive balls 650 are placed on the pads 600 and a wafer level packaging structure 700 is obtained.

Figure 2J:
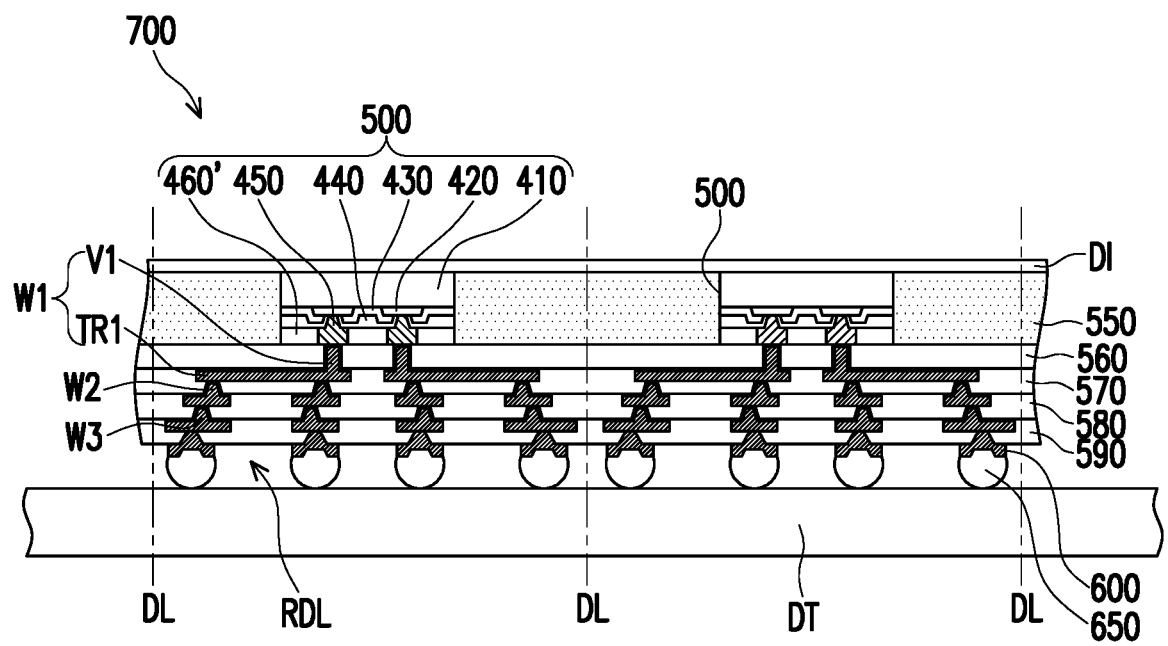

Referring to FIG. 2J, the wafer-level packaging structure 700 is flipped (turned upside down) and attached or adhered onto a dicing tape DT. In some embodiments, the dicing tape may include PVC, polyolefin, polyethylene, or other suitable materials as long as the material is able to hold the above-mentioned structures. Thereafter, a de-bonding process is performed such that the carrier C is de-bonded and removed from the wafer-level packaging structure 700. In some embodiments, after removing the carrier C and the de-bonding layer DB, the dielectric layer DI of the wafer-level packaging structure 700 is exposed. In some embodiments, the dielectric layer DI may be removed or ground to reveal the bottom surface of the insulating encapsulant 550, but the disclosure is not limited thereto.

Still referring to FIG. 2J, a dicing process is performed along the dicing lines DL to cut the above-mentioned structures 700 (cutting through the dielectric layer DI, the insulating encapsulant 550, and redistribution circuit structure RDL) into a plurality of individual packages 70. In some embodiments, the dicing process may include a mechanical blade sawing process or laser cutting process.

Figure 2K:
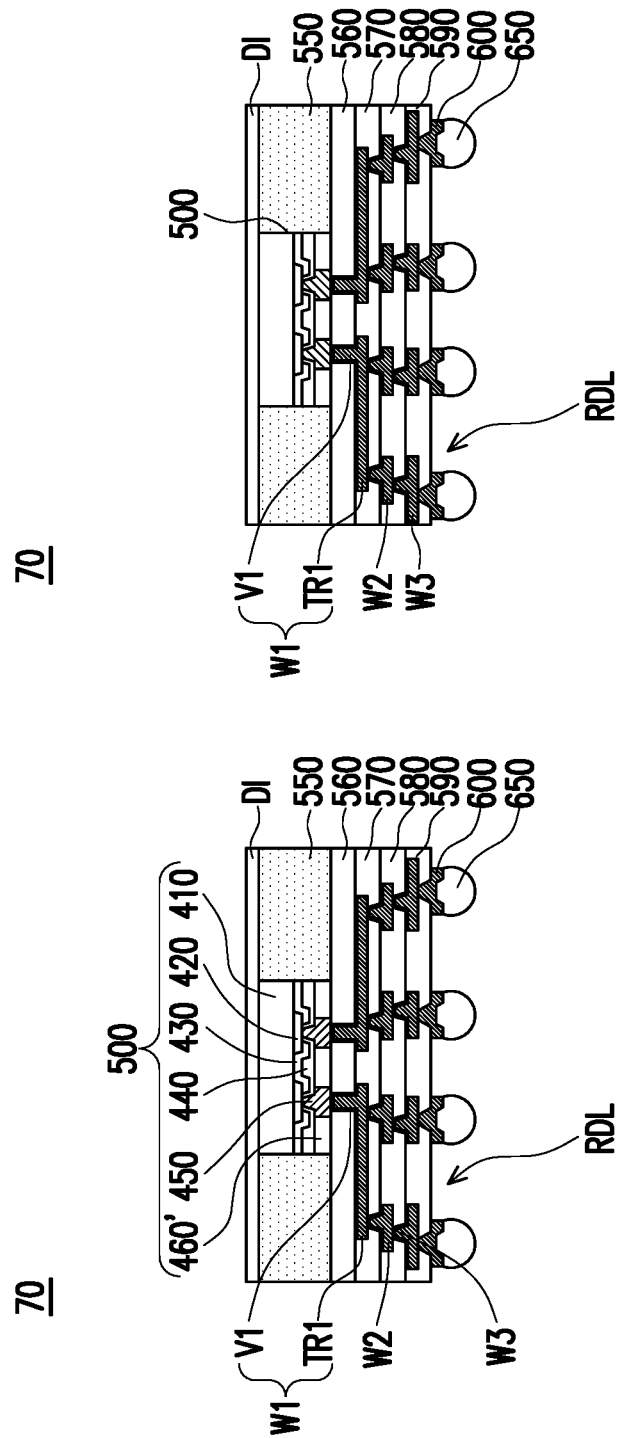

As shown in FIG. 2K, after the dicing process, the separated packages 70 may each include the dielectric layer DI, the semiconductor die 500 formed on the dielectric layer DI and laterally encapsulated by the insulating encapsulant 550, and the redistribution circuit structure RDL formed on the semiconductor die 500 and electrically connected to the semiconductor die 500, wherein the redistribution circuit structure RDL includes the plurality of conductive wirings W1, W2, W3 and the plurality of dielectric layers 560, 570, 580, 590 stacked alternately. In one embodiment, the package 70 is an integrate fan-out (InFO) package, and the conductive wirings W1 include at least the vias V1 embedded in the dielectric layer 260.

Based on above, by using the photosensitive mask pattern PM, small-sized via openings are achievable due to the applied photosensitive material having high resolution and high pattern contrast properties. The formation of vias of smaller sizes leads to a larger process window for the via openings, especially for the alignment of the via openings toward the underlying conductive pillars. Better alignment leads to less via shifting (location shifting of the via) relative to the underlying conductive pillar. Hence, an overlay tolerance of the via relative to the underlying conductive pillar for subsequent via formations is also improved. In other words, the smaller the ratio of via size to the pillar size, the greater the overlay tolerance of the via(s). Therefore, a redistribution circuit structure that copes with the miniaturization scheme is realized.

In accordance with some embodiments of the present disclosure, a method of manufacturing a semiconductor package including the following steps is provided. Semiconductor dies having conductive pillars are provided. The semiconductor dies are encapsulated with an insulating encapsulant. A planarization process is performed to the insulating encapsulant to expose the conductive pillars. A redistribution circuit structure is formed on the insulating encapsulant and the semiconductor dies, and the redistribution circuit structure is electrically connected to the semiconductor dies. A forming method of the redistribution circuit structure includes the following steps. A seed layer is formed over the insulating encapsulant and the semiconductor dies. A photosensitive mask pattern having a CD of about 5 microns or smaller than 5 microns on the seed layer, wherein the photosensitive mask pattern is formed with a plurality of openings therein and the plurality of openings exposes portions of the seed layer. A plurality of conductive vias is formed on the exposed portions of the seed layer within the plurality of openings. The photosensitive mask pattern and portions of the seed layer not covered by the plurality of conductive vias are removed. A dielectric layer is then formed, wherein the conductive vias are embedded in the dielectric layer.

In accordance with some embodiments of the present disclosure, a method of manufacturing a semiconductor package including the following steps is provided. Semiconductor dies having conductive pillars are provided. The semiconductor dies are encapsulated with an insulating encapsulant. A planarization process is performed to the insulating encapsulant to expose the conductive pillars. A redistribution circuit structure is formed on the insulating encapsulant and the semiconductor dies, and the redistribution circuit structure is electrically connected to the semiconductor dies. A forming method of the redistribution circuit structure includes the following steps. A dielectric layer is formed over the semiconductor die and the insulating encapsulant. A hard mask layer is formed on the dielectric layer. A photosensitive mask pattern having a CD of about 5 microns or smaller than 5 microns is formed on the dielectric layer, wherein the photosensitive mask pattern is formed with a plurality of first openings therein and the plurality of first openings exposes portions of the hard mask layer. Portions of the dielectric layer are removed using the photosensitive mask pattern as a mask to form a plurality of second openings in the dielectric layer. The photosensitive mask pattern and the hard mask layer are removed. A plurality of conductive vias filling up the plurality of second openings of the dielectric layer is formed.

In accordance with some embodiments of the present disclosure, a semiconductor package is provided. A semiconductor die is laterally encapsulated by an insulating encapsulant, wherein the semiconductor die has conductive pillars. A redistribution circuit structure is disposed on the insulating encapsulant and the semiconductor die, and the redistribution circuit structure is electrically connected to the semiconductor die, wherein the redistribution circuit structure includes a dielectric layer disposed on the semiconductor die and covering the insulating encapsulant, and conductive vias inlaid within the dielectric layer and connected with the conductive pillars, and at least one of the plurality of conductive vias has a critical dimension of about 5 microns or less than 5 microns.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method of manufacturing a semiconductor package, comprising:

providing semiconductor dies having conductive pillars;

encapsulating the semiconductor dies with an insulating encapsulant;

performing a planarization process to the insulating encapsulant to expose the conductive pillars;

forming a redistribution circuit structure on the planarized insulating encapsulant and the semiconductor dies, the redistribution circuit structure being electrically connected to the semiconductor dies; and performing a dicing process to the redistribution circuit structure, the planarized insulating encapsulant and the semiconductor dies, and forming the redistribution circuit structure comprising:

forming a dielectric layer over the semiconductor dies and the insulating encapsulant;

forming a hard mask layer on the dielectric layer;

forming a photosensitive mask pattern having a resolution of about 5 microns or smaller than 5 microns on the hard mask layer, wherein the photosensitive mask pattern is formed with a plurality of first openings therein and the plurality of first openings having a diameter less than about 5 microns exposes portions of the hard mask layer;

removing portions of the hard mask layer and the dielectric layer using the photosensitive mask pattern as a mask to form a plurality of second openings in the dielectric layer to reveal the conductive pillars and simultaneously removing the photosensitive mask pattern to expose the underlying hard mask layer;

removing the hard mask layer; and forming a plurality of conductive vias filling up the plurality of second openings of the dielectric layer.

2. The method as claimed in claim 1, wherein the plurality of conductive vias is formed with a critical dimension of about 5 microns or less than 5 microns.

3. The method as claimed in claim 1, wherein the plurality of conductive vias is formed with an aspect ratio ranging from about 1 to about 10.

4. The method as claimed in claim 1, wherein the plurality of conductive vias is formed with an aspect ratio ranging from about 4 to about 10.

5. The method as claimed in claim 1, wherein forming the hard mask layer comprises sputtering sequentially a titanium layer and a copper layer.

6. The method as claimed in claim 1, wherein forming a photosensitive mask pattern includes forming a photosensitive material comprising phenol formaldehyde resins, acrylate resins, or epoxy resin.

7. The method as claimed in claim 1, further comprising forming a seed layer conformally covering the plurality of second openings and the dielectric layer.

8. The method as claimed in claim 1, wherein removing portions of the dielectric layer includes performing an anisotropic etching process, and portions of the photosensitive mask pattern are removed during the anisotropic etching process.

9. The method as claimed in claim 1, wherein removing portions of the dielectric layer using the photosensitive mask pattern as a mask further comprises performing an etching process to remove the exposed portions of the hard mask layer and the underlying dielectric layer until the conductive pillars are revealed.

10. A method of manufacturing a semiconductor package, comprising:
providing semiconductor dies having conductive pillars;
encapsulating the semiconductor dies with an insulating encapsulant;
performing a planarization process to the insulating encapsulant to expose the conductive pillars;
forming a dielectric layer over the semiconductor dies and the planarized insulating encapsulant;
forming a hard mask layer on the dielectric layer;
forming a photosensitive mask pattern having a resolution of about 5 microns or smaller than 5 microns on the hard mask layer, wherein the photosensitive mask pattern is formed with a plurality of first openings therein and the plurality of first openings having a diameter less than about 5 microns exposes portions of the hard mask layer;
removing portions of the hard mask layer and the dielectric layer using the photosensitive mask pattern as a mask to form a plurality of second openings having a diameter less than about 5 microns and an aspect ratio ranging from about 4 to about 10 in the dielectric layer to reveal the conductive pillars and simultaneously removing the photosensitive mask pattern to expose the underlying hard mask layer;
removing the hard mask layer;
forming a seed layer over the dielectric layer and over the plurality of second openings;
forming a plurality of metal patterns on the seed layer and filling up the plurality of second openings;
forming dielectric layers and conductive wirings over the plurality of metal patterns to form a redistribution circuit structure on the planarized insulating encapsulant and the semiconductor dies, wherein the redistribution circuit structure is electrically connected to the semiconductor dies; and
performing a dicing process to the redistribution circuit structure, the planarized insulating encapsulant and the semiconductor dies.

11. The method of claim 10, wherein forming a plurality of metal patterns on the seed layer and filling up the plurality of second openings includes forming a plurality of conductive vias on the seed layer and filling up the plurality of second openings and forming a plurality of traces extending on the seed layer.

12. The method of claim 10, further comprising forming conductive balls on the redistribution structure.

13. The method of claim 10, wherein forming the hard mask layer comprises sputtering sequentially a titanium layer and a copper layer.

14. The method of claim 10, wherein forming a photosensitive mask pattern includes forming a photosensitive material comprising phenol formaldehyde resins, acrylate resins, or epoxy resin.

15. A method of manufacturing a semiconductor package, comprising:
encapsulating semiconductor dies with an insulating encapsulant;
removing portions of the insulating encapsulant to expose conductive pillars of the semiconductor dies;
forming a dielectric layer covering the conductive pillars of the semiconductor dies and the insulating encapsulant;
forming a hard mask layer on the dielectric layer;
forming a photosensitive mask pattern with first openings on the hard mask layer, wherein the photosensitive mask pattern is formed of a material having a resolution of about 5 microns or smaller than 5 microns, the first openings have a critical dimension less than about 5 microns and expose portions of the hard mask layer;
etching off portions of the hard mask layer and the underlying dielectric layer using the photosensitive mask pattern as a mask to form second openings in the dielectric layer to expose the conductive pillars and simultaneously etching off the photosensitive mask pattern to expose the underlying hard mask layer;
removing the hard mask layer;
forming a plurality of conductive patterns on the dielectric layer and filling up the second openings of the dielectric layer; and
performing a dicing process to the dielectric layer, the plurality of conductive patterns, the insulating encapsulant and the semiconductor dies.

16. The method of claim 15, wherein removing portions of the insulating encapsulant to expose conductive pillars of the semiconductor dies includes performing a chemical mechanical polishing process to remove the insulating encapsulant until the conductive pillars are exposed.

17. The method of claim 15, wherein sizes of the second openings are smaller than sizes of the conductive pillars.

18. The method of claim 15, wherein the second openings are formed in the dielectric layer with a critical dimension of about 5 microns or less than 5 microns.

19. The method of claim 15, wherein forming a hard mask layer comprises sputtering.

* * * * *